United States Patent [19]

Nelson

[11] Patent Number: 5,060,245

[45] Date of Patent: Oct. 22, 1991

[54] INTERLINE TRANSFER CCD IMAGE SENSING APPARATUS

[75] Inventor: Edward T. Nelson, Pittsford, N.Y.

[73] Assignee: The United States of America as represented by the Secretary of the Air Force, Washington, D.C.

[21] Appl. No.: 546,472

[22] Filed: Jun. 29, 1990

[51] Int. Cl.$^5$ .................. G11C 19/28; H01L 29/78; H01L 27/14; H04N 3/14

[52] U.S. Cl. .................. 377/60; 357/24; 357/30; 358/213.26; 358/213.29

[58] Field of Search ............... 357/24, 30; 377/57–63; 358/213.26, 213.29

[56] References Cited

U.S. PATENT DOCUMENTS

| | | | |
|---|---|---|---|
| Re. 31,612 | 6/1984 | Sauer | 307/221 D |
| 3,890,633 | 6/1975 | Kosonocky | 357/24 |
| 3,913,077 | 10/1975 | Erb | 340/173 R |
| 4,613,402 | 9/1986 | Losee et al. | 156/643 |
| 4,908,684 | 3/1990 | Koike et al. | 357/24 L |
| 4,928,158 | 5/1990 | Kimata | 357/24 L |

Primary Examiner—Gene M. Munson
Attorney, Agent, or Firm—William Stepanishen; Donald J. Singer

[57] ABSTRACT

In interline transfer type image sensing devices, photogenerated charge is transferred from a collection node into a charge coupled shift register. The framing rate of these detectors is typically limited by the maximum readout rate of the shift register. A CCD image sensing device with multiple shift register outputs for higher framing rate, utilizes alternating shift register orientations and multiplexing of multiple shift registers to a each output in order to match the pitches of the detector columns and output bondpads. This configuration allows detectors of different size to be made more easily. This detector additionally uses a combination of low-lag photodiodes, low transfer inefficiency true two-phase charge coupled shift registers, and low noise charge sensing amplifiers to provide non-interlaced readout of the image with minimum signal loss and noise while operating at high frame rates.

3 Claims, 2 Drawing Sheets

INTERLINE TRANSFER CCD IMAGE SENSING APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to a CCD image sensing apparatus and, more particularly, to an interline transfer CCD image sensing apparatus with multiple outputs for high framing rate.

The state of the art of interline transfer CCD image sensing apparatus is well represented and alleviated to some degree by the prior art apparatus and approaches which are contained in the following U.S. Patents:

U.S. Pat. No. RE 31,612 issued to Sauer on 26 June 1984;
U.S. Pat. No. 3,890,633 issued to Kosonocky et al on 17 June 1975;
U.S. Pat. No. 3,913,077 issued to Erb on 14 Oct. 1975; and
U.S. Pat. No. 4,613,402 issued to Losee et al on 23 Sept. 1986.

The Sauer patent is directed to CCD input circuits which include a floating diffusion, a source supplying a controllable amount of charge to the floating diffusion and a charge coupled device (CCD) reference register for periodically removing a fixed amount of charge from the floating diffusion. A feedback circuit sense the average voltage at the floating diffusion and adjusts the controllable amount of charge supplied to the diffusion to maintain its average voltage-level constant The Kosonocky patent describes a charge-coupled, light-sensing array, in which every third charge storage electrode is maintained at a direct voltage level. Charge is shifted between such electrodes by two voltage phases, each varying in amplitude from a level lower then to a level greater than said direct voltage level, applied to two intervening charge storage electrodes, respectively.

The Erb patent discloses a CCD memory device having on a single chip a parallel multi-channel storage section into which data is fed by a serial input register and from which data is read by a serial output register. Although at least two storage electrodes are needed throughout the memory to store each bit of information, the total number of such electrodes required in the input and output registers is greatly reduced by alternately storing the input and output bits at even and odd numbered storage electrodes of the input and output registers, so that each storage electrode may serve a separate channel of the parallel storage section.

The Losee et al patent discusses a method for accurately aligning the edge of the implanted barrier in a semiconductor substrate with the edge of its overlying electrode, which is necessary to the making of CCD's. This position is less sensitive to processing parameters.

In interline transfer type imaging devices, photogenerated charge is collected on a PN junction or under the gate of a photocapacitor, for a period of time and then transferred into a charge coupled register to be detected by an output circuit. In an area array of such photocharge collection sites it is necessary to transfer the collected photocharge, first to a vertical shift register and then to a horizontal shift register, finally, reaching a charge sensitive detector or amplifier.

In prior art, as indicated schematically in FIG. 1, all of the photocharge is read out through a single charge sensing circuit. The maximum rate at which such circuit can operate is typically less than 20 MHz, and in turn limits the frame rate at which the detector may be operated.

Commercially-available detectors in the prior art are subjected to this limitation in the maximum framing rate, this limitation can be overcome by the use of multiple shift register outputs. When many outputs are required, it becomes difficult to make contact between the package electrodes and the die output electrodes (bondpads) because of a lack of space. As the detector size and number of outputs increases, this problem becomes more severe. Thus, it is advantageous to have the outputs distributed equally about the die edge, and to match the pitch of the detector such that an increase in resolution does not reduce the spacing between bondpads.

When operating with low photosignal levels, interline transfer CCD detectors made with conventional photodiodes suffer from signal loss due to the lag mechanism. To overcome this problem, a special Pinned Photodiode has been disclosed as in B. C. Burkey, W. C. Chang, J. Littlehale, T. J. Lee, T. J. Tredwell, J. P. Lavine, E. A. Trabka, *The Pinned Photodiode for an Interline-Transfer CCD Image Sensor*, Proc. IEEE International Electron Devices Meeting, Dec. 9-12, 1984, p. 28.

When operating at high clocking speeds, and with long phase lengths, the transfer of charge in CCD shift registers become inefficient because of inadequate time for the charge to diffuse out of the past storage phase and into the next storage phase. In this case, the transfer efficiency may be improved by a design and fabrication process that results in electric fields within each phase that drifts the stored charge rapidly forward into the next phase. This method has been disclosed in J. Hynecek, *Design and Performance of a High-Resolution Image Sensor for Color TV Applications*, IEEE Trans. Electron. Dev., Vol. ED-32, (1985), p. 1421.

Prior interline CCD photodiode detectors have used a four-phase or pseudo-two phase CCD interline (vertical) shift register. These approaches require an interlaced readout of the image. For applications with time varying scene illumination, the interlaced readout results in the field flicker artifact. The patent of Losee et al U.S. Pat. No. 4,613,402 discloses a true-two phase CCD gate structure permitting non-interlaced readout of array detectors.

When operating at high data rates it is advantageous to use charge sensing amplifier circuits that have high sensitivity and low noise. The prior art, such as disclosed in E. G. Stevens, T-H. Lee, D. N. Nichols, C. N. Anagnostopoulos, B. C. Burkey, W. C. Chang, T. M. Kelly, P. Khosla, D. L. Losee, T. J. Tredwell, *A 1.4 Million Element CCD Image Sensor*, Proc. Int. Solid State Circuits Conf., Feb. 25, 1987, p. 114, for example, uses a floating diffusion sensing node with two following source follower stages.

While the above-cited references are instructive, there still remains a need to provide a method to measure the surface temperature of reacting and nonreacting materials. The present invention is intended to satisfy that need.

SUMMARY OF THE INVENTION

The present invention utilizes a plurality of interline CCD registers to read out pinned photodiodes to provide an image sensor with minimized signal loss and low readout noise under conditions of very high framing rates. The combination of pinned photodiodes, CCD shift registers with built-in longitudinal electric fields, two-stage floating diffusion signal charge sensing amplifiers, and multiple register outputs provides operation at high framing rates with minimizes signal loss.

It is a further object of this invention to provide for output electrodes that match the pitch of the detector array. This object is achieved through a multiple output architecture with alternation of shift register shift direction and column multiplexing.

It is a further object of this invention to provide for non-interlaced readout of the detector array. This is achieved using the structure of Losee et al.

These and other advantages, objects and features of the invention will become more apparent after considering the following description taken in conjunction with the illustrative embodiment in the accompanying drawings.

DESCRIPTION OF THE PREFERRED EMBODIMENT

Figure 1:
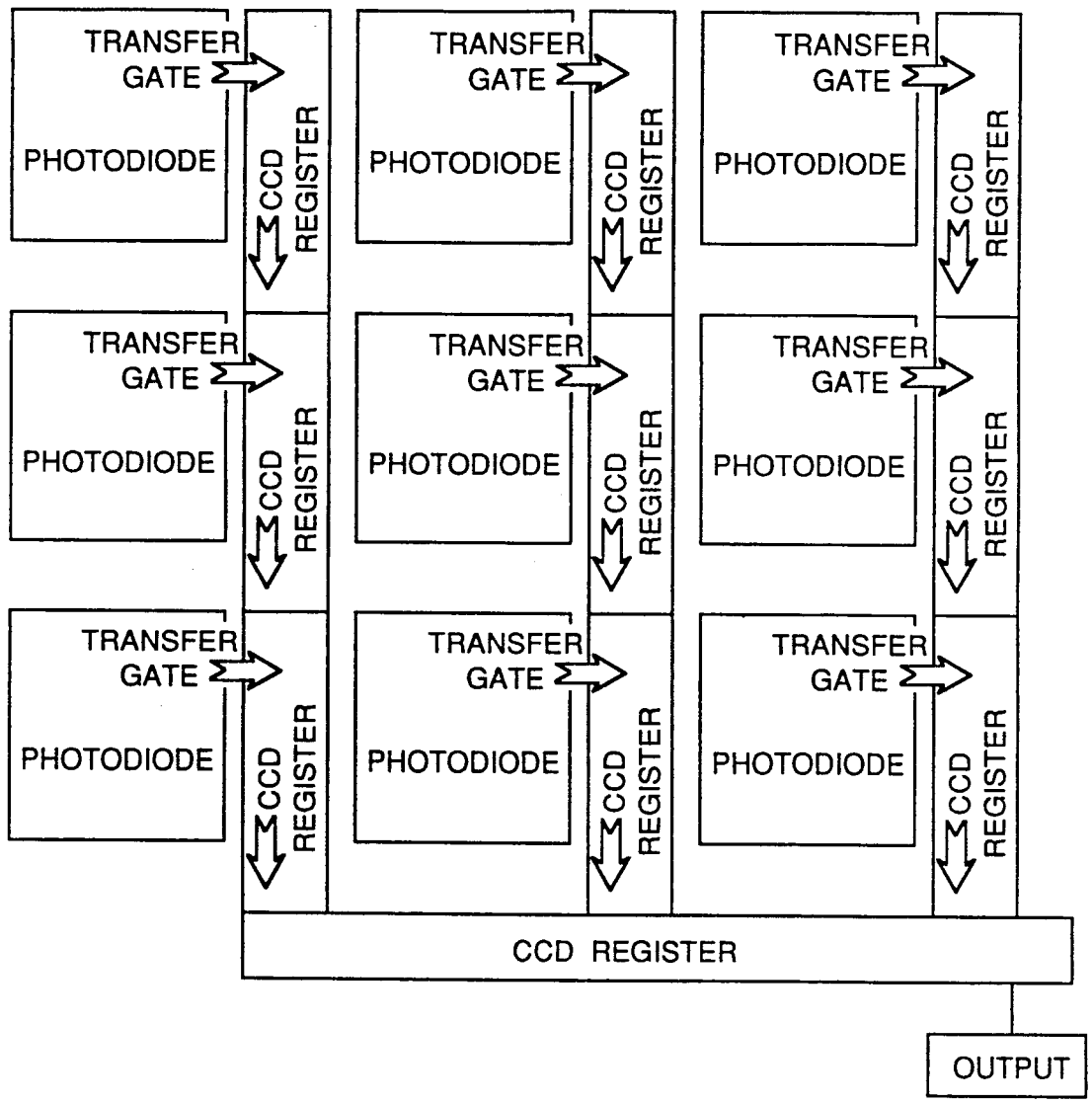
FIG. 1 is a block diagram of a typical prior art imaging device.
Figure 2:
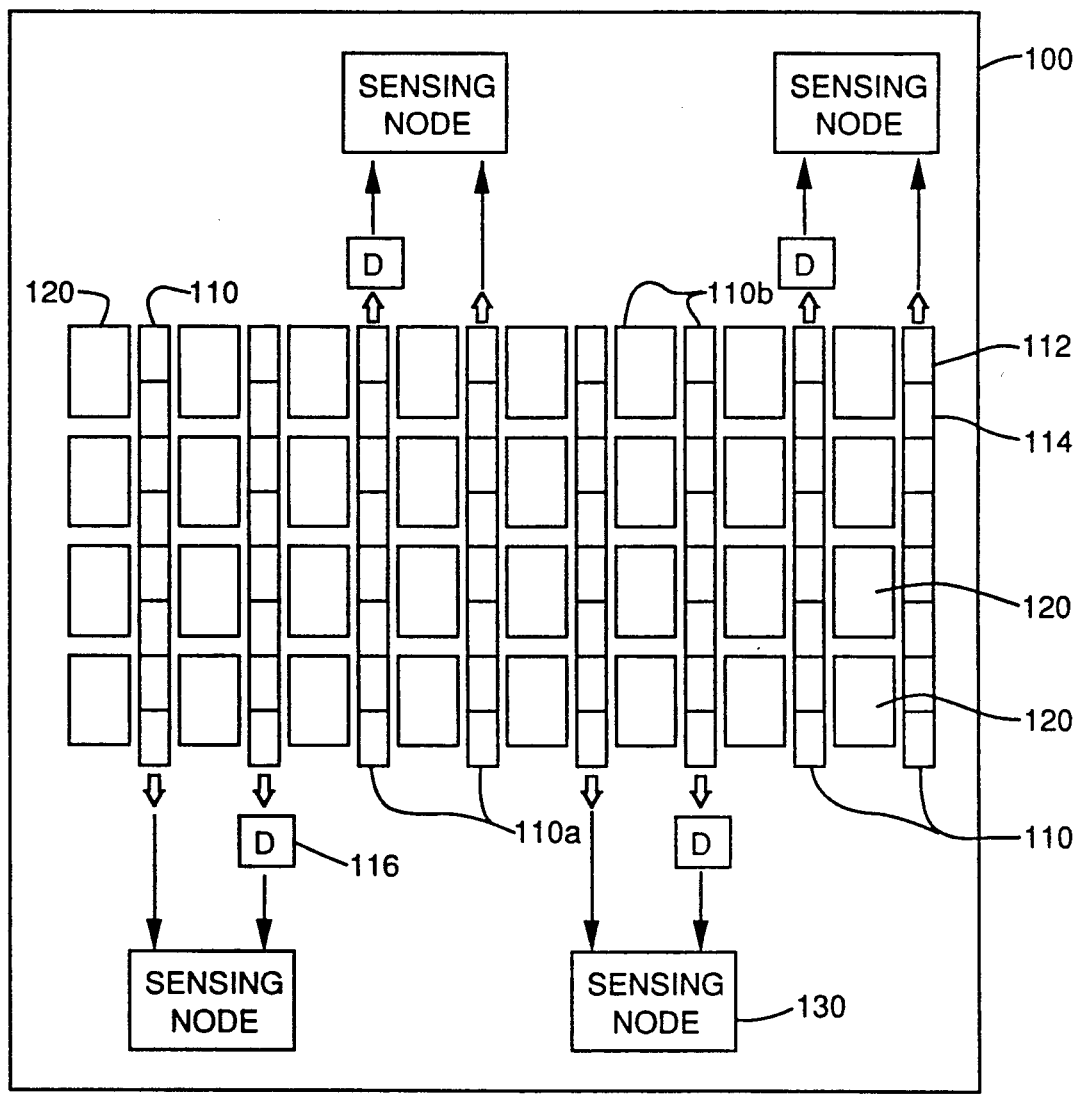
FIG. 2 is a block diagram of an interline transfer CCD image sensing apparatus according to the present invention.

Referring now to FIG. 2, there is shown a block diagram of the interline transfer CCD image sensing apparatus utilizing a semiconductor substrate 100 with a plurality of CCD shift registers 110. The CCD shift registers 110 are arranged in parallel columns which are interweaved between columns of photodiodes 120. Two adjacent CCD registers which direct charge in the same direction toward a single sensing node 130, comprise a CCD register pair. Adjacent CCD register pairs, such as pairs 110a and 110b, for example, conduct charge in opposite directions to their respective sensing nodes. It may be clearly seen that the charge transfer paths from adjacent CCD register pairs are in the opposite directions as indicated by the arrows in FIG. 2. The photodiodes in the present illustration are pinned photodiodes of the type described in *The Pinned Photodiode for an Interline-Transfer CCD Image Sensor* by B. C. Burkey et al. The sensing nodes 130 may comprise floating diffusion charge sensing amplifiers.

The interline transfer CCD image sensing apparatus operates in the following manner. Charges from the photodiodes 120 are clocked through the CCD shift registers 110 in the directions shown, by suitable placement of the barrier regions beneath the leading or trailing edge of each CCD phase. The phases are formed of alternate first and second levels of polysilicon labeled 112 and 114 and are positioned adjacent to each photodiode, thus allowing non-interlaced readout of the array. An extra phase gate 116 is inserted into one output column of each shift register pair to introduce a half-cycle delay in the clocking of signal charges to the respective shift register pair sense amplifier 130. This results in a two to one multiplexing of the charge transfer signal in the pairs of signal output columns to a single output without the requirement of a double rate clock.

The following description gives an example of a typical apparatus that may be constructed according to the present invention. An interline transfer CCD image sensing apparatus with a 128 horizontal by 128 vertical resolution was made.

The pinned photodiodes were made according to the procedures described by Burkey et al. The CCD shift registers were made according to the procedures described by Losee et al in U.S. Pat. No. 4,613,402, with narrowing of the CCD register so as to build in longitudinal electric fields as described in J. Hynecek.

In this form, clocked at 40,000 frames per second, the detector showed less than 10 percent lag in reading out the photodiodes, a readout noise floor of less than 100 electrons noise (RMS), and less than 20 percent signal loss due to CCD transfer inefficiency.

The present embodiment of this detector had square pixels of 32 microns on each side, resulting in a pitch of the bondpads of 128 microns. This pitch was large enough to allow a standard bondpad size of 125 microns. The 128 micron bondpad pitch was matched by thin-film hybrid metal electrodes, and so provided pitch-matching between the detector electrodes and the package electrodes.

Although the invention has been described with reference to a particular embodiment, it will be understood to those skilled in the art that the invention is capable of a variety of alternative embodiments within the spirit and scope of the appended claims.

What is claimed is:

1. An interline transfer CCD image sensing apparatus comprising in combination:
   a plurality of photodiode arranged in a predetermined number of columns each containing a predetermined number of photodiodes,
   a plurality of CCD registers arranged in a predetermined number of columns which are parallel to and interweaved with said columns of photodiodes, said columns of photodiodes respectively cooperating with a CCD register of said plurality of CCD registers, said plurality of CCD registers arranged such that two adjacent CCD register columns form a register pair which transfers charges in a predetermined direction, adjacent register pairs transfer charges in opposite directions and one register of each register pair includes a clock gate at the output of said register, said clock gate provides an extra one-half clock cycle to the transfer charge, said register pairs providing a first and second charge signal, and
   a plurality of sensing nodes, each sensing node of said plurality of sensing nodes respectively receiving said first and second charge signal from a register pair.

2. An interline transfer CCD image sensing apparatus as described in claim 1 wherein a plurality of first and second phase gates are operationally connected to and aligned with said plurality of CCD registers, said plurality of first and second phase gates are respectively aligned with said plurality of photodiodes such that there is a first and second phase gate for each photodiode of said plurality of photodiodes.

3. An interline transfer CCD image sensing apparatus as described in claim 2 wherein said first and second phase gates are respectively maintained at opposite potentials.

* * * * *